(12) United States Patent
Minns et al.

(10) Patent No.: US 8,383,553 B2
(45) Date of Patent: Feb. 26, 2013

(54) DYES

(75) Inventors: Richard A. Minns, Arlington, MA (US); David Waller, Lexington, MA (US)

(73) Assignee: Merck Patent GmbH, Darmstadt (DE)

( * ) Notice: Subject to any disclaimer, the term of this patent is extended or adjusted under 35 U.S.C. 154(b) by 616 days.

(21) Appl. No.: 12/236,150

(22) Filed: Sep. 23, 2008

(65) Prior Publication Data

US 2009/0107552 A1    Apr. 30, 2009

Related U.S. Application Data

(60) Provisional application No. 60/982,872, filed on Oct. 26, 2007.

(51) Int. Cl.
*C01B 35/45* (2006.01)
*H01L 25/00* (2006.01)
*H01L 31/00* (2006.01)
*C07F 15/00* (2006.01)

(52) U.S. Cl. ........ 505/445; 136/243; 136/252; 136/256; 136/263; 136/291; 546/2

(58) Field of Classification Search ............. 136/263, 136/243, 252, 256, 291; 546/12, 2; 505/445
See application file for complete search history.

(56) References Cited

FOREIGN PATENT DOCUMENTS

| | | | |
|---|---|---|---|
| FR | 2 862 429 | | 5/2005 |
| JP | 2001-226607 | * | 8/2001 |
| JP | 2001 291534 | | 10/2001 |
| JP | 2001-291534 | * | 10/2001 |
| WO | WO 2007/091525 | | 8/2007 |
| WO | WO 2008/120810 | | 10/2008 |

OTHER PUBLICATIONS

Database WPI Week 200228, Thomson Scientific, London, GB; AN 2002-220820, XP-002524022.
Database WPI Week 200782, Thomson Scientific, London, GB; AN 2007-893640, XP-002524023.
Krebs and Biancardo, "Dye sensitized photovoltaic cells: Attaching conjugated polymers to zwitterionic ruthenium dyes," Solar Energy Materials & Solar Cells, 90:142-165, 2006.
Sauer et al., "From 1,2,4-Triazines and Tributyl(ethynyl)tin to Stannylated Bi- and Terpyridines: The Cycloaddition Pathway," Eur. J. Org. Chem., 1999(1):313-321, 1999.
Thomas et al., "Zinc(II) and Ruthenium(II) Complexes of Novel Fluorene Substituted Terpyridine Ligands: Synthesis, Spectroscopy and Electrochemistry", J. Chinese Chem. Society, 49(5):833-840, 2002.

* cited by examiner

*Primary Examiner* — Ling Choi
*Assistant Examiner* — Monique Peets
(74) *Attorney, Agent, or Firm* — Bowditch & Dewey, LLP

(57) ABSTRACT

Novel dyes, as well as related photovoltaic cells, components, systems, and methods, are disclosed.

39 Claims, 3 Drawing Sheets

DYES

CROSS-REFERENCE TO RELATED APPLICATION

Under 35 U.S.C. §119, this application claims priority to U.S. Provisional Patent Application Ser. No. 60/982,872, filed Oct. 26, 2007, the entire contents of which are hereby incorporated by reference.

STATEMENT REGARDING FEDERALLY SPONSORED RESEARCH

This invention was supported by contract number DMI-0450532 awarded by the National Science Foundation. The U.S. Government has certain rights in the invention.

TECHNICAL FIELD

This disclosure relates to novel dyes, as well as related photovoltaic cells, components, systems, and methods.

BACKGROUND

Photovoltaic cells, sometimes called solar cells, can convert light, such as sunlight, into electrical energy. One type of photovoltaic cell is a dye-sensitized solar cell (DSSC).

Referring to FIG. 1, a DSSC 100 includes a charge carrier layer 140 (e.g., including an electrolyte, such as an iodide/iodine solution) and a photoactive layer 150 (e.g., including a semiconductor material, such as $TiO_2$ particles) disposed between an electrode 101 and a counter electrode 111. Photoactive layer 150 also includes a photosensitizing agent, such as a dye. In general, the photosensitizing agent is capable of absorbing photons within a wavelength range of operation (e.g., within the solar spectrum). Electrode 101 includes a substrate 170 (e.g., a glass or polymer substrate) and an electrically conductive layer 160 (e.g., an ITO layer or tin oxide layer) disposed on an inner surface 172 of substrate 170. Counter electrode 111 includes a substrate 110, an electrically conductive layer 120 (e.g., ITO layer or tin oxide layer), and a catalytic layer 130 (e.g., containing platinum), which catalyzes a redox reaction in charge carrier layer 140. Electrically conductive layer 120 is disposed on an inner surface 112 of substrate 110, while catalytic layer 130 is disposed on a surface 122 of electrically conductive layer 120. Electrode 101 and counter electrode 111 are connected by wires across an external electrical load 180.

During operation, in response to illumination by radiation (e.g., in the solar spectrum), DSSC 100 undergoes cycles of excitation, oxidation, and reduction that produce a flow of electrons across load 180. Incident light excites photosensitizing agent molecules in photoactive layer 150. The photoexcited photosensitizing agent molecules then inject electrons into the conduction band of the semiconductor in photoactive layer 150, which leaves the photosensitizing agent molecules oxidized. The injected electrons flow through the semiconductor material, to electrically conductive layer 160, then to external load 180. After flowing through external load 180, the electrons flow to layer 120, then to layer 130 and subsequently to layer 140, where the electrons reduce the electrolyte material in charge carrier layer 140 at catalytic layer 130. The reduced electrolyte can then reduce the oxidized photosensitizing agent molecules back to their neutral state. The electrolyte in layer 140 can act as a redox mediator to control the flow of electrons from counter electrode 111 to working electrode 101. This cycle of excitation, oxidation, and reduction is repeated to provide continuous electrical energy to external load 180.

SUMMARY

This disclosure relates to novel dyes, as well as related photovoltaic cells, components, systems, and methods.

In one aspect, the disclosure features a set of compounds, each of which includes a complex of formula (Ia): $MX_3L$ (Ia). In formula (Ia), M is a transition metal ion; each X, independently, is a monodentate ligand selected from the group consisting of thiocyanate, isothiocyanate, and pyridine optionally substituted with halo, $C_1$-$C_{20}$ alkoxy, $C_1$-$C_{20}$ alkyl, $C_2$-$C_{20}$ alkenyl, $C_2$-$C_{20}$ alkynyl, $C_3$-$C_{20}$ cycloalkyl, $C_3$-$C_{20}$ cycloalkenyl, $C_1$-$C_{20}$ heterocycloalkyl, $C_1$-$C_{20}$ heterocycloalkenyl, aryl, or heteroaryl; and L is a tridentate ligand of formula (II):

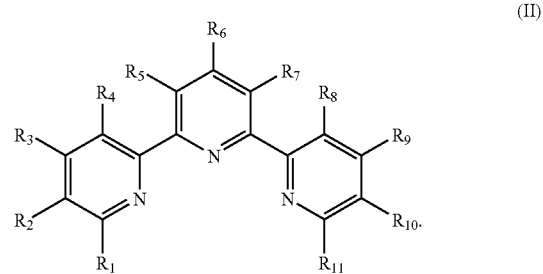

In formula (II), at least one of $R_1$, $R_2$, $R_3$, $R_4$, $R_5$, $R_6$, $R_7$, $R_8$, $R_9$, $R_{10}$, and $R_{11}$ is alkenylaryl, alkynylaryl, heteroaryl, alkenylheteroaryl, or alkynylheteroaryl; and each of the others of $R_1$, $R_2$, $R_3$, $R_4$, $R_5$, $R_6$, $R_7$, $R_8$, $R_9$, $R_{10}$, and $R_{11}$, independently, is H, COOH, $PO_3H$, halo, $C_1$-$C_{20}$ alkoxy, $C_1$-$C_{20}$ alkyl, $C_2$-$C_{20}$ alkenyl, $C_2$-$C_{20}$ alkynyl, $C_3$-$C_{20}$ cycloalkyl, $C_3$-$C_{20}$ cycloalkenyl, $C_1$-$C_{20}$ heterocycloalkyl, $C_1$-$C_{20}$ heterocycloalkenyl, aryl, heteroaryl, alkenylaryl group, alkynylaryl group, alkenylheteroaryl, or alkynylheteroaryl.

In another aspect, the disclosure features another set of compounds, each of which includes a complex of formula (Ib): MXYL (Ib). In formula (Ib), M is a transition metal ion; X is a monodentate ligand selected from the group consisting of thiocyanate, isothiocyanate, and pyridine optionally substituted with halo, $C_1$-$C_{20}$ alkoxy, $C_1$-$C_{20}$ alkyl, $C_2$-$C_{20}$ alkenyl, $C_2$-$C_{20}$ alkynyl, $C_3$-$C_{20}$ cycloalkyl, $C_3$-$C_{20}$ cycloalkenyl, $C_1$-$C_{20}$ heterocycloalkyl, $C_1$-$C_{20}$ heterocycloalkenyl, aryl, or heteroaryl; Y is a didentate ligand selected from the group consisting of 1,10-phenanthroline and 2,2'-bipyridine, each of which is optionally substituted with halo, $C_1$-$C_{20}$ alkoxy, $C_1$-$C_{20}$ alkyl, $C_2$-$C_{20}$ alkenyl, $C_2$-$C_{20}$ alkynyl, $C_3$-$C_{20}$ cycloalkyl, $C_3$-$C_{20}$ cycloalkenyl, $C_1$-$C_{20}$ heterocycloalkyl, $C_1$-$C_{20}$ heterocycloalkenyl, aryl, or heteroaryl; and L is a tridentate ligand of formula (II) as described above.

In still another aspect, the disclosure features articles that include first and second electrodes; and a photoactive layer between the first and second electrodes. The photoactive layer includes at least one of the compounds described above. The article is configured as a photovoltaic cell.

In yet another aspect, this disclosure features modules that include a plurality of photovoltaic cells. At least two of the photovoltaic cells are electrically connected and at least one of the photovoltaic cells includes at least one of the compounds described above.

Embodiments can include one or more of the following features.

In some embodiments, $R_6$ is alkenylaryl, alkynylaryl, heteroaryl, alkenylheteroaryl, or alkynylheteroaryl. For example, $R_6$ can be

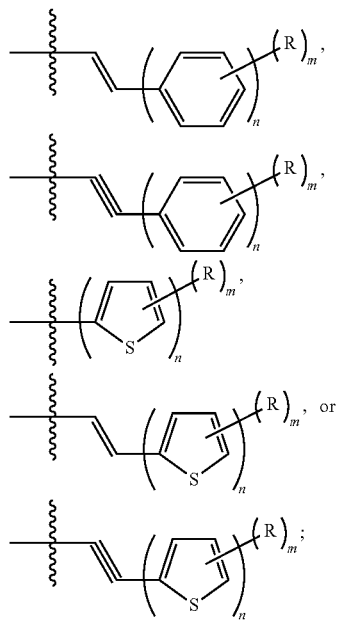

in which n can be 1, 2, or 3; m can be 1, 2, or 3; and each R, independently, can be COOH, $PO_3H$,

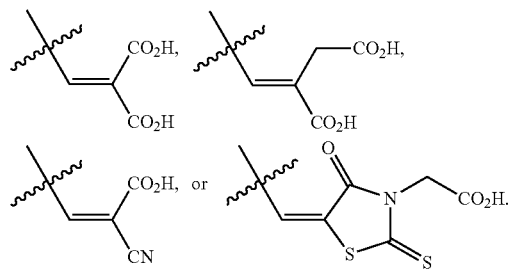

In certain embodiments, $R_6$ is

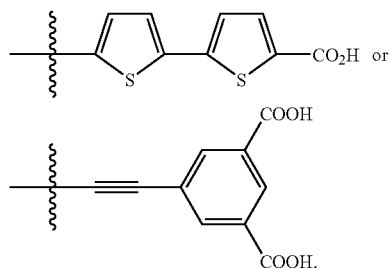

In some embodiments, the transition metal ion is selected from the group consisting of ruthenium ions, osmium ions, and iron ions. For example, the transition metal ion can be Ru(II), Os(II), or Fe(II).

In some embodiments, each X is isothiocyanate.

In some embodiments, the complex is

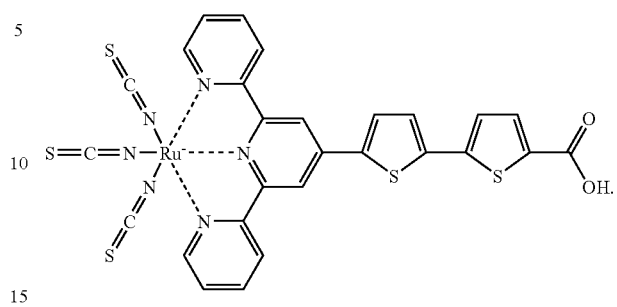

In some embodiments, each of $R_3$, $R_6$, and $R_9$, independently, is alkenylaryl, alkynylaryl, heteroaryl, alkenylheteroaryl, or alkynylheteroaryl. For example, each of $R_3$, $R_6$, and $R_9$, independently, can be

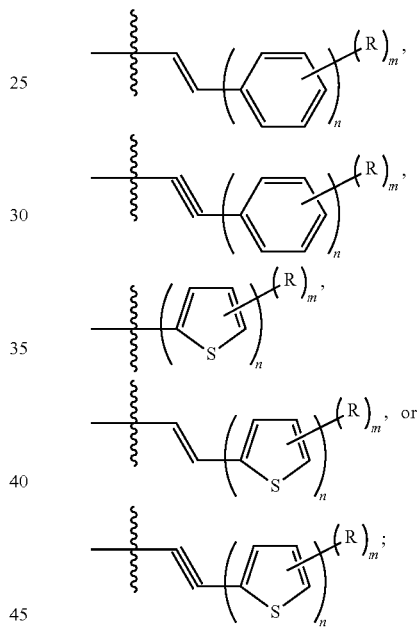

in which n can be 1, 2, or 3; m can be 1, 2, or 3; and each R, independently, can be COOH, $PO_3H$,

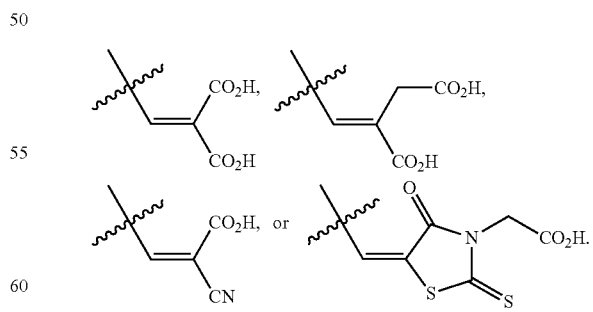

In some embodiments, the compound can further include an counterion, such as $Bu_4N^+$.

In some embodiments, the photoactive layer further includes interconnected metal oxide nanoparticles associated with the compound.

In some embodiments, Y is unsubstituted 1,10-phenanthroline or unsubstituted 2,2'-bipyridine.

Embodiments can include one or more of the following advantages.

In some embodiments, the compounds described above can have relatively high molar extinction coefficients across the visible light spectrum and therefore high absorption at this wavelength range. As such, a DSSC containing such compounds can have improved efficiency.

Other features and advantages will be apparent from the description, drawings and claims.

DESCRIPTION OF DRAWINGS

Like reference symbols in the various drawings indicate like elements.

DETAILED DESCRIPTION

Figure 1:
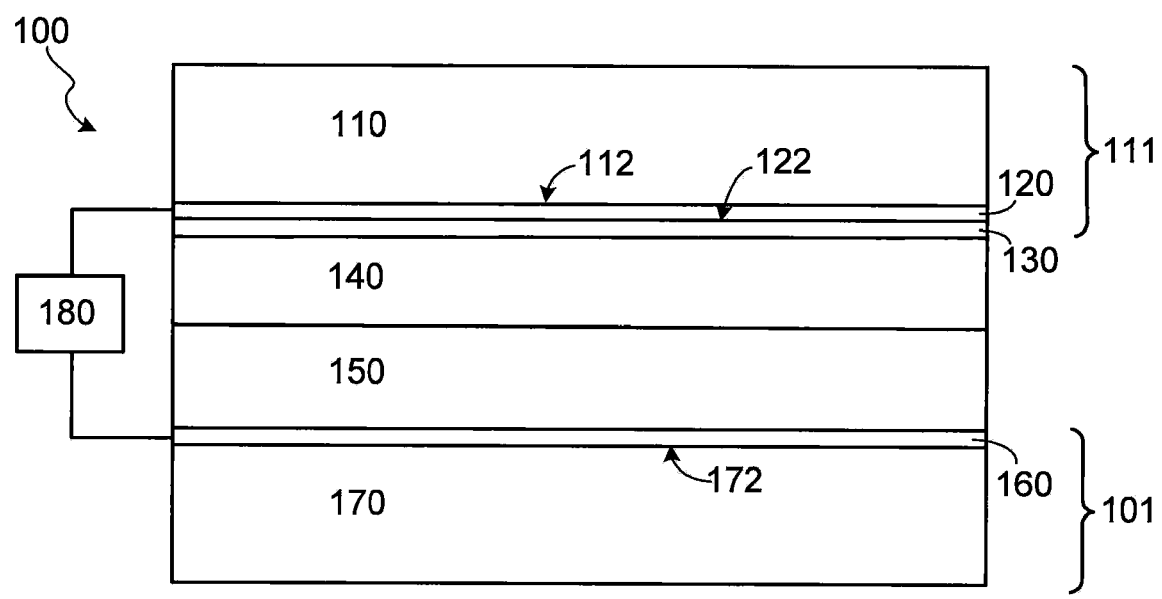
FIG. 1 is a cross-sectional view of an embodiment of a photovoltaic cell.
Figure 2:
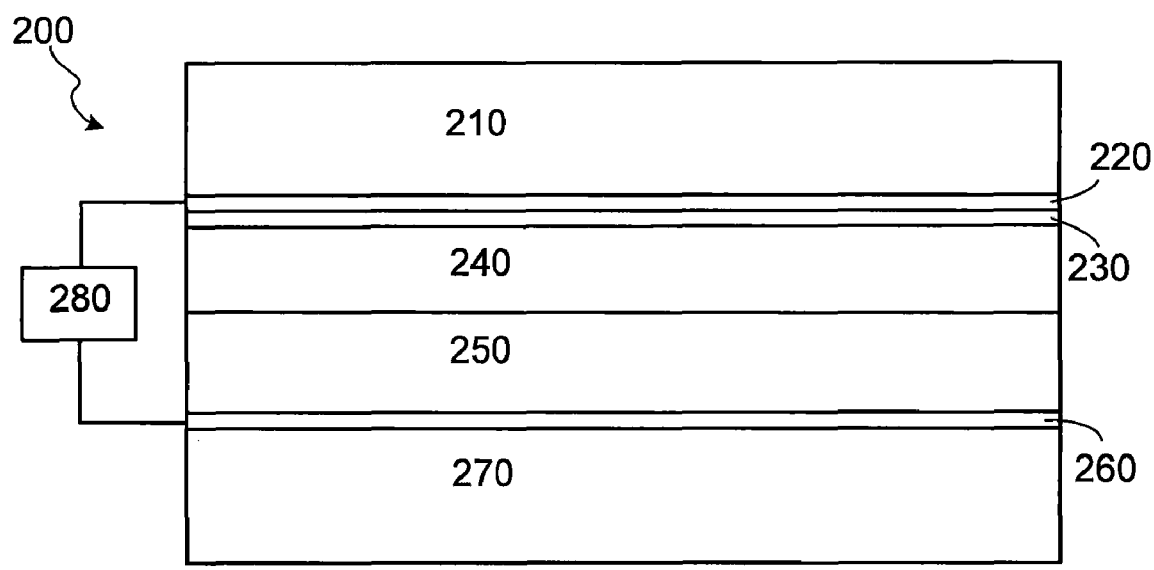
FIG. 2 is a cross-sectional view of another embodiment of a photovoltaic cell.

FIG. 2 describes a DSSC 200 that includes a substrate 210, an electrically conductive layer 220, a catalyst layer 230, a charge carrier layer 240, a photoactive layer 250, an electrically conductive layer 260, and a substrate 270. Layers 220 and 260 are electrically connected to an external load 280.

In general, photoactive layer 250 includes a semiconductor material and a photosensitizing agent, such as a dye. In some embodiments, the dye can include a complex of formula (Ia) or (Ib): $MX_3L$ (Ia) or MXYL (Ib). In certain embodiments, photoactive layer 250 can include two or more of the just-mentioned dyes.

In some embodiments, M can be a transition metal ion. Examples of suitable transition metal ions include ruthenium ions (e.g., Ru(II)), osmium ions (e.g., Os(II)), and iron ions (e.g., Fe(II)).

In some embodiments, each X, independently, is a monodentate ligand selected from the group consisting of thiocyanate, isothiocyanate, and pyridine optionally substituted with halo, $C_1$-$C_{20}$ alkoxy, $C_1$-$C_{20}$ alkyl, $C_2$-$C_{20}$ alkenyl, $C_2$-$C_{20}$ alkynyl, $C_3$-$C_{20}$ cycloalkyl, $C_3$-$C_{20}$ cycloalkenyl, $C_1$-$C_{20}$ heterocycloalkyl, $C_1$-$C_{20}$ heterocycloalkenyl, aryl, or heteroaryl. In some embodiments, Y is a didentate ligand selected from the group consisting of 1,10-phenanthroline and 2,2'-bipyridine, each of which is optionally substituted with halo, $C_1$-$C_{20}$ alkoxy, $C_1$-$C_{20}$ alkyl, $C_2$-$C_{20}$ alkenyl, $C_2$-$C_{20}$ alkynyl, $C_3$-$C_{20}$ cycloalkyl, $C_3$-$C_{20}$ cycloalkenyl, $C_1$-$C_{20}$ heterocycloalkyl, $C_1$-$C_{20}$ heterocycloalkenyl, aryl, or heteroaryl.

The term "alkyl" refers to a saturated, linear or branched hydrocarbon moiety, such as —$CH_3$ or —$CH(CH_3)_2$. The term "alkenyl" refers to a linear or branched hydrocarbon moiety that contains at least one double bond, such as —CH═CH—$CH_3$. The term "alkynyl" refers to a linear or branched hydrocarbon moiety that contains at least one triple bond, such as —C≡C—$CH_3$. The term "alkoxy" refers to a saturated, linear or branched hydrocarbon moiety containing an oxygen radical, such as —$OCH_3$ or —$OCH(CH_3)_2$. The term "cycloalkyl" refers to a saturated, cyclic hydrocarbon moiety, such as cyclohexyl. The term "cycloalkenyl" refers to a non-aromatic, cyclic hydrocarbon moiety that contains at least one double bond, such as cyclohexenyl. The term "heterocycloalkyl" refers to a saturated, cyclic moiety having at least one ring heteroatom (e.g., N, O, or S), such as 4-tetrahydropyranyl. The term "heterocycloalkenyl" refers to a non-aromatic, cyclic moiety having at least one ring heteroatom (e.g., N, O, or S) and at least one ring double bond, such as pyranyl. The term "aryl" refers to a hydrocarbon moiety having one or more aromatic rings. Examples of aryl moieties include phenyl (Ph), phenylene, naphthyl, naphthylene, pyrenyl, anthryl, and phenanthryl. The term "heteroaryl" refers to a moiety having one or more aromatic rings that contain at least one heteroatom (e.g., N, O, or S). Examples of heteroaryl moieties include furyl, furylene, fluorenyl, pyrrolyl, thienyl, oxazolyl, imidazolyl, thiazolyl, pyridyl, pyrimidinyl, quinazolinyl, quinolyl, isoquinolyl and indolyl. The term "alkenylaryl" refers to a hydrocarbon moiety having one or more aryl groups and at least one alkenyl group attached to one of the aryl groups, such as

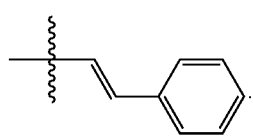 [SMILES: */C=C/c1ccccc1]

The term "alkynylaryl" refers to a hydrocarbon moiety having one or more aryl groups and at least one alkynyl group attached to one of the aryl groups, such as

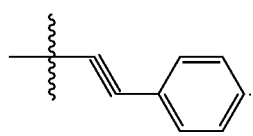 [SMILES: *C#Cc1ccccc1]

The term "alkenylheteroaryl" refers to a hydrocarbon moiety having one or more heteroaryl groups and at least one alkenyl group attached to one of the heteroaryl groups, such as

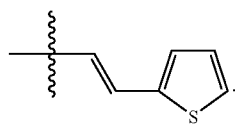 [SMILES: */C=C/c1cccs1]

The term "alkynylheteroaryl" refers to a hydrocarbon moiety having one or more heteroaryl groups and at least one alkynyl group attached to one of the heteroaryl groups, such as

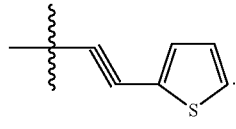

The terms "$C_1$-$C_{20}$," "$C_2$-$C_{20}$," and "$C_3$-$C_{20}$," refers to a moiety containing 1 to 20 carbon atoms (e.g., one, two, three, four, five, six, seven, eight, nine, 10, 11, 12, 13, 14, 15, 16, 17, 18, 19, and 20 carbon atoms), a moiety containing 2 to 20 carbon atoms, and a moiety containing 3 to 20 carbon atoms, respectively.

Alkyl, alkenyl, alkynyl, cycloalkyl, cycloalkenyl, heterocycloalkyl, heterocycloalkenyl, aryl, heteroaryl, alkenylaryl, alkynylaryl, alkenylheteroaryl, and alkynylheteroaryl mentioned herein include both substituted and unsubstituted moieties, unless specified otherwise. Possible substituents on cycloalkyl, cycloalkenyl, heterocycloalkyl, heterocycloalkenyl, aryl, and heteroaryl include, but are not limited to, $C_1$-$C_{20}$ alkyl, $C_2$-$C_{20}$ alkenyl, $C_2$-$C_{20}$ alkynyl, $C_3$-$C_{20}$ cycloalkyl, $C_3$-$C_{20}$ cycloalkenyl, $C_1$-$C_{20}$ heterocycloalkyl, $C_1$-$C_{20}$ heterocycloalkenyl, $C_1$-$C_{20}$ alkoxy, aryl, aryloxy, heteroaryl, heteroaryloxy, amino, $C_1$-$C_{20}$ alkylamino, $C_1$-$C_{40}$ dialkylamino, arylamino, diarylamino, $C_1$-$C_{20}$ alkylsulfonamino, arylsulfonamino, $C_1$-$C_{20}$ alkylimino, arylimino, $C_1$-$C_{20}$ alkylsulfonimino, arylsulfonimino, hydroxyl, halo, thio, $C_1$-$C_{20}$ alkylthio, arylthio, $C_1$-$C_{20}$ alkylsulfonyl, arylsulfonyl, acylamino, aminoacyl, aminothioacyl, amidino, guanidine, ureido, cyano, nitro, nitroso, azido, acyl, thioacyl, acyloxy, carboxyl, and carboxylic ester. On the other hand, possible substituents on alkyl, alkenyl, or alkynyl include all of the above-recited substituents except $C_1$-$C_{20}$ alkyl. Cycloalkyl, cycloalkenyl, heterocycloalkyl, heterocycloalkenyl, aryl, heteroaryl, alkenylaryl, alkynylaryl, alkenylheteroaryl, and alkynylheteroaryl can also be fused with each other.

In some embodiments, L is a tridentate ligand of formula (II):

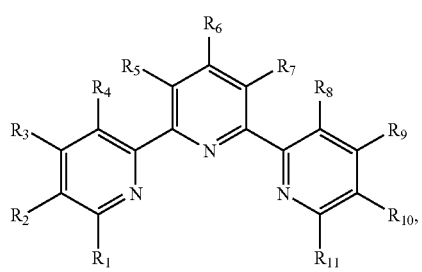

(II)

in which at least one of $R_1$, $R_2$, $R_3$, $R_4$, $R_5$, $R_6$, $R_7$, $R_8$, $R_9$, $R_{10}$, and $R_{11}$ is alkenylaryl, alkynylaryl, heteroaryl, alkenylheteroaryl, or alkynylheteroaryl; and each of the others of $R_1$, $R_2$, $R_3$, $R_4$, $R_5$, $R_6$, $R_7$, $R_8$, $R_9$, $R_{10}$, and $R_{11}$, independently, is H, COOH, $PO_3H$, halo, $C_1$-$C_{20}$ alkoxy, $C_1$-$C_{20}$ alkyl, $C_2$-$C_{20}$ alkenyl, $C_2$-$C_{20}$ alkynyl, $C_3$-$C_{20}$ cycloalkyl, $C_3$-$C_{20}$ cycloalkenyl, $C_1$-$C_{20}$ heterocycloalkyl, $C_1$-$C_{20}$ heterocycloalkenyl, aryl, heteroaryl, alkenylaryl group, alkynylaryl group, alkenylheteroaryl, or alkynylheteroaryl.

In some embodiments, the terpyridiyl group in formula (II) can be substituted with at least one (e.g., one, two, or three) substituents (e.g., alkenylaryl, alkynylaryl, heteroaryl, alkenylheteroaryl, or alkynylheteroaryl) to form a ligand with an extended conjugation. Examples of suitable substituents include

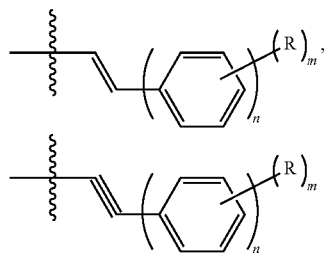

(such as

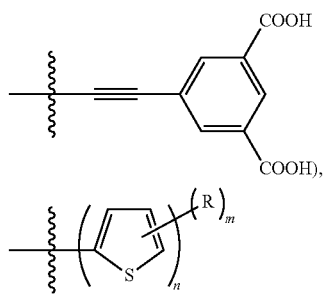

(such as

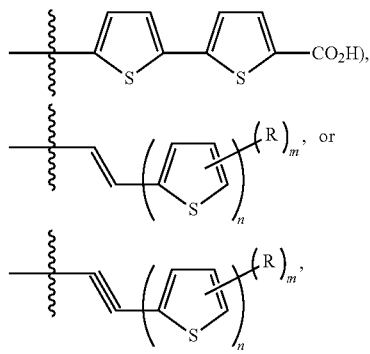

in which n can be 1, 2, or 3 and m can be 1, 2, or 3. In some embodiments, R can be a group that contains an acid moiety. Examples of suitable R include COOH, $PO_3H$,

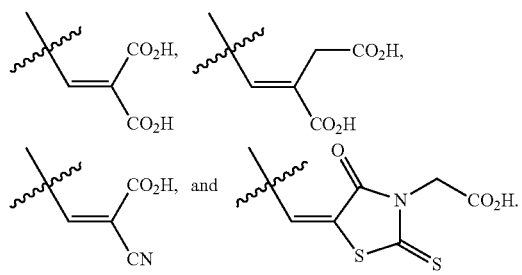

In some embodiments, one of the aryl groups (e.g., a phenyl group) or the heteroaryl groups (e.g., a thienyl group) in the just-mentioned substituents can be substituted with one or more R groups. In certain embodiments, two or more of the aryl or heteroaryl groups in the just-mentioned substituents can be substituted with one or more R groups. Without wishing to be bound by theory, it is believed that R can serve as an anchoring group to facilitate association of the dye with the semiconductor material (e.g., titanium oxide nanoparticles) in photoactive layer 250 and that the substituents can serve as molecular wires to facilitate transfer of excited electrons generated from M to the semiconductor material. In addition, without wishing to be bound by theory, it is believed that a ligand having an extended conjugation can enhance the molar extinction coefficient of the dye.

In some embodiments, the dye can be a zwitterion. For example, the complex of formula (Ia) or (Ib) can include a positive charge on one atom and a negative charge on another atom and therefore is a neutral molecule. In some embodiments, the dye can include a complex having a charge (e.g., a negative charge) and a counterion having an opposite charge (e.g., a positive charge). An exemplary dye is (Compound 1)

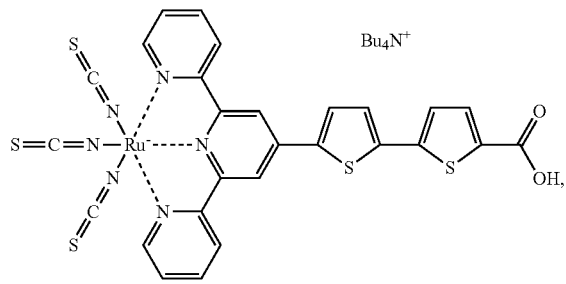

in which the counterion is $Bu_4N^+$.

In some embodiments, the dye can have a molar extinction coefficient of at least about 8,000 (e.g., at least about 10,000, at least about 13,000, at least about 15,000, at least about 18,000, at least about 20,000, at least about 23,000, at least about 25,000, at least about 28,000, and at least about 30,000) at a given wavelength (e.g., $\lambda_{max}$) within the visible light spectrum.

In general, the dye can be prepared by methods known in the art. Example 1 below provide detailed descriptions of how compound 1 was actually prepared. The scheme shown below illustrates a typical synthetic route for synthesizing certain exemplary compounds. In this scheme, $R_6$ is define in the summary section above.

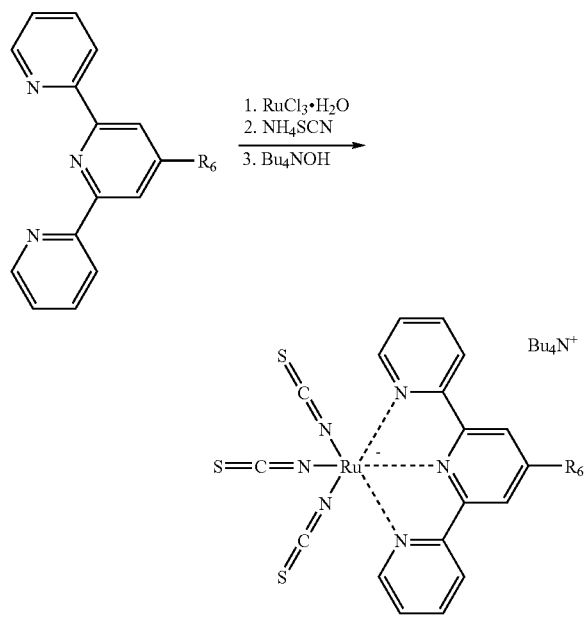

Specifically, as shown in the scheme above, an exemplary dye can be prepared by reacting a substituted terpyridine with a ruthenium salt (e.g., ruthenium chloride) and a thiocyanate salt (e.g., ammonium thiocyanate) in the presence of a base (e.g., tetrabutyl ammonium hydroxide). The substituted terpyridine can be prepared by methods known in the art, such as the methods described in Example 1 below and in Constable et. al., *Polyhedron*, 2004, 23:135, the entire contents of which are hereby incorporated by reference.

In general, photoactive layer 250 also includes a semiconductor material that is associated with the dye. Examples of semiconductor materials include materials having the formula $M_xO_y$, where M can be, for example, titanium, zirconium, tungsten, niobium, lanthanum, tantalum, terbium, or tin, and x and y are integers greater than zero. Other suitable materials include sulfides, selenides, tellurides, and oxides of titanium, zirconium, tungsten, niobium, lanthanum, tantalum, terbium, tin, or combinations thereof. For example, $TiO_2$, $SrTiO_3$, $CaTiO_3$, $ZrO_2$, $WO_3$, $La_2O_3$, $Nb_2O_5$, $SnO_2$, sodium titanate, cadmium selenide (CdSe), cadmium sulphides, and potassium niobate can be suitable materials.

Typically, the semiconductor material contained within layer 250 is in the form of nanoparticles. In some embodiments, the nanoparticles have an average size between about 2 nm and about 100 nm (e.g., between about 10 nm and about 40 nm, such as about 20 nm).

The nanoparticles can be interconnected, for example, by high temperature sintering, or by a reactive polymeric linking agent, such as poly(n-butyl titanate). A polymeric linking agent can enable the fabrication of an interconnected nanoparticle layer at relatively low temperatures (e.g., less than about 300° C.) and in some embodiments at room temperature. The relatively low temperature interconnection process can be amenable to continuous manufacturing processes using polymer substrates.

The interconnected nanoparticles are generally photosensitized by the dye(s). A dye facilitates conversion of incident light into electricity to produce the desired photovoltaic effect. It is believed that the dye absorbs incident light resulting in the excitation of electrons in the dye. The energy of the excited electrons is then transferred from the excitation levels of the dye into a conduction band of the interconnected nanoparticles. This electron transfer results in an effective separation of charge and the desired photovoltaic effect. Accordingly, the electrons in the conduction band of the interconnected nanoparticles are made available to drive an external load.

The dye(s) can be sorbed (e.g., chemisorbed and/or physisorbed) on the nanoparticles. A dye can be selected, for example, based on its ability to absorb photons in a wavelength range of operation (e.g., within the visible spectrum), its ability to produce free electrons (or electron holes) in a conduction band of the nanoparticles, its effectiveness in complexing with or sorbing to the nanoparticles, and/or its color.

Turning now to other components of DSSC 200, substrate 210 can be formed from a mechanically-flexible material, such as a flexible polymer, or a rigid material, such as a glass. Examples of polymers that can be used to form a flexible substrate include polyethylene naphthalates (PEN), polyethylene terephthalates (PET), polyethyelenes, polypropylenes, polyamides, polymethylmethacrylate, polycarbonate, and/or polyurethanes. Flexible substrates can facilitate continuous manufacturing processes such as web-based coating and lamination.

The thickness of substrate 210 can vary as desired. Typically, substrate thickness and type are selected to provide mechanical support sufficient for the DSSC to withstand the rigors of manufacturing, deployment, and use. Substrate 210 can have a thickness of from about six microns to about 5,000 microns (e.g., from about 6 microns to about 50 microns, from about 50 microns to about 5,000 microns, from about 100 microns to about 1,000 microns).

In some embodiments, substrate 210 is formed from a transparent material. For example, substrate 210 can be formed from a transparent glass or polymer, such as a silica-based glass or a polymer, such as those listed above. In such embodiments, electrically conductive layer 220 should also be transparent.

In general, the composition and thickness of electrically conductive layer 220 can be selected based on desired electrical conductivity, optical properties, and/or mechanical properties of the layer. In some embodiments, layer 220 is transparent. Examples of transparent materials suitable for forming such a layer include certain metal oxides, such as indium tin oxide (ITO), tin oxide, and a fluorine-doped tin oxide. In some embodiments, electrically conductive layer 220 can be formed of a foil (e.g., a titanium foil). Electrically conductive layer 220 may be, for example, between about 100 nm and about 500 nm thick, (e.g., between about 150 nm and about 300 nm thick).

In embodiments where electrically conductive layer 260 is transparent, electrically conductive layer 220 can be opaque (i.e., can transmit less than about 10% of the visible spectrum energy incident thereon). For example, layer 220 can be formed from a continuous layer of an opaque metal, such as copper, aluminum, indium, or gold.

In some embodiments, electrically conductive layer 220 can include a discontinuous layer of a conductive material. For example, electrically conductive layer 220 can include an electrically conducting mesh. Suitable mesh materials include metals, such as palladium, titanium, platinum, stainless steels and alloys thereof. In some embodiments, the mesh material includes a metal wire. The electrically conductive mesh material can also include an electrically insulating material that has been coated with an electrically conducting material, such as a metal. The electrically insulating material can include a fiber, such as a textile fiber or monofilament. Examples of fibers include synthetic polymeric fibers (e.g., nylons) and natural fibers (e.g., flax, cotton, wool, and silk). The mesh electrode can be flexible to facilitate, for example, formation of the DSSC by a continuous manufacturing process. Photovoltaic cells having mesh electrodes are disclosed, for example, in co-pending U.S. Patent Application Publication No. 2003/0230337, U.S. Patent Application Publication No. 2004/0187911, and International Patent Application Publication No. WO 03/04117, each of which is hereby incorporated by reference.

The mesh electrode may take a wide variety of forms with respect to, for example, wire (or fiber) diameters and mesh densities (i.e., the number of wires (or fibers) per unit area of the mesh). The mesh can be, for example, regular or irregular, with any number of opening shapes. Mesh form factors (such as, e.g., wire diameter and mesh density) can be chosen, for example, based on the conductivity of the wire (or fibers) of the mesh, the desired optical transmissivity, flexibility, and/or mechanical strength. Typically, the mesh electrode includes a wire (or fiber) mesh with an average wire (or fiber) diameter in the range from about one micron to about 400 microns, and an average open area between wires (or fibers) in the range from about 60% to about 95%.

Catalyst layer 230 is generally formed of a material that can catalyze a redox reaction in the charge carrier layer positioned below. Examples of materials from which catalyst layer can be formed include platinum and poly(3,4-ethylenedioxythiophene) (PEDOT). PEDOT layers are discussed in U.S. Patent Application Publication No. 2005-0045851, the entire contents of which are hereby incorporated by reference. Materials can be selected based on criteria such as, e.g., their compatibility with manufacturing processes, long term stability, and optical properties. In general, the catalyst layer is substantially transparent. However, in certain embodiments, e.g., embodiments in which electrically conductive layer 260 is substantially transparent, catalyst layer 230 can be substantially opaque.

As discussed previously, charge carrier layer 240 includes a material that facilitates the transfer of electrical charge from a ground potential or a current source to photoactive layer 250. A general class of suitable charge carrier materials include solvent-based liquid electrolytes, polyelectrolytes, polymeric electrolytes, solid electrolytes, n-type and p-type transporting materials (e.g., conducting polymers) and gel electrolytes. Other choices for charge carrier media are possible. For example, the charge carrier layer can include a lithium salt that has the formula LiX, where X is an iodide, bromide, chloride, perchlorate, thiocyanate, trifluoromethyl sulfonate, or hexafluorophosphate.

The charge carrier media typically includes a redox system. Suitable redox systems may include organic and/or inorganic redox systems. Examples of such systems include cerium(III) sulphate/cerium(IV), sodium bromide/bromine, lithium iodide/iodine, $Fe^{2+}/Fe^{3+}$, $Co^{2+}/Co^{3+}$, and viologens. Furthermore, an electrolyte solution may have the formula $M_iX_j$, where i and j are integers greater than or equal to one, where X is an anion, and M is lithium, copper, barium, zinc, nickel, a lanthanide, cobalt, calcium, aluminum, or magnesium. Suitable anions include chloride, perchlorate, thiocyanate, trifluoromethyl sulfonate, and hexafluorophosphate.

In some embodiments, the charge carrier media includes a polymeric electrolyte. For example, the polymeric electrolyte can include poly(vinyl imidazolium halide) and lithium iodide and/or polyvinyl pyridinium salts. In some embodiments, the charge carrier media can include a solid electrolyte, such as lithium iodide, pyridimum iodide, and/or substituted imidazolium iodide.

The charge carrier media can include various types of polymeric polyelectrolytes. For example, suitable polyelectrolytes can include between about 5% and about 95% (e.g., 5-60%, 5-40%, or 5-20%) by weight of a polymer, e.g., an ion-conducting polymer, about 5% to about 95% (e.g., about 35-95%, 60-95%, or 80-95%) by weight of a plasticizer, about 0.05 M to about 10 M of a redox electrolyte of organic or inorganic iodides (e.g., about 0.05-2 M, 0.05-1 M, or 0.05-0.5 M), and about 0.01 M to about 1 M (e.g., about 0.05-0.5 M, 0.05-0.2 M, or 0.05-0.1 M) of iodine. The ion-conducting polymer may include, for example, polyethylene oxide (PEO), polyacrylonitrile (PAN), polymethylmethacrylate (PMMA), polyethers, and polyphenols. Examples of suitable plasticizers include ethyl carbonate, propylene carbonate, mixtures of carbonates, organic phosphates, butyrolactone, and dialkylphthalates.

Substrate 270 and electrically conductive layer 260 can be similar to substrate 210 and electrically conductive layer 220, respectively. For example, substrate 270 can be formed from the same materials and can have the same thickness as substrate 210. In some embodiments however, it may be desirable for substrate 270 to be different from 210 in one or more aspects. For example, where the DSSC is manufactured using a process that places different stresses on the different substrates, it may be desirable for substrate 270 to be more or less mechanically robust than substrate 210. Accordingly, substrate 270 may be formed from a different material, or may have a different thickness that substrate 210. Furthermore, in embodiments where only one substrate is exposed to an illumination source during use, it is not necessary for both substrates and/or electrically conducting layers to be transparent.

Accordingly, one of substrates and/or corresponding electrically conducting layer can be opaque.

In some embodiments, DSSC 200 can be manufactured by a continuous process, such as a roll-to-roll process. Examples of roll-to-roll processes have been described in, for example, commonly owned U.S. Pat. No. 7,022,910, the entire contents of which are hereby incorporated by reference.

Figure 3:
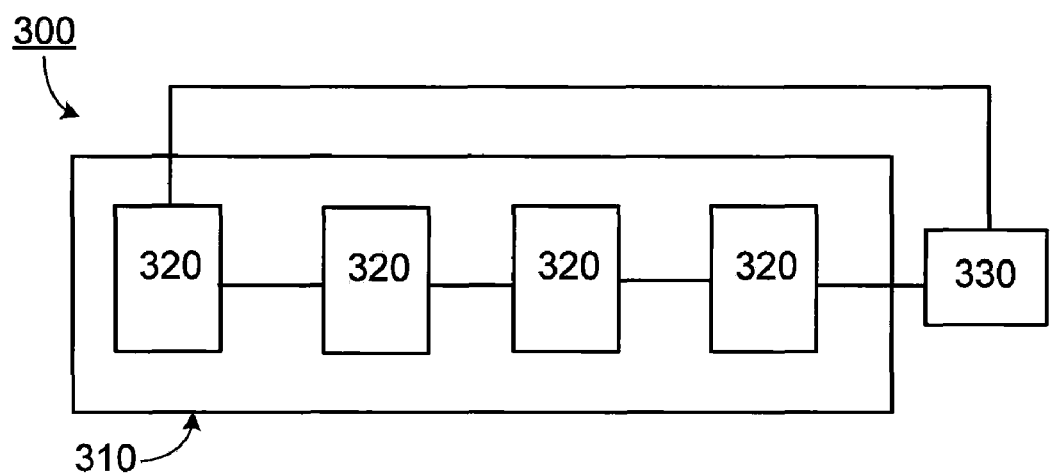
FIG. 3 is a schematic of a system containing multiple photovoltaic cells electrically connected in series.
Figure 4:
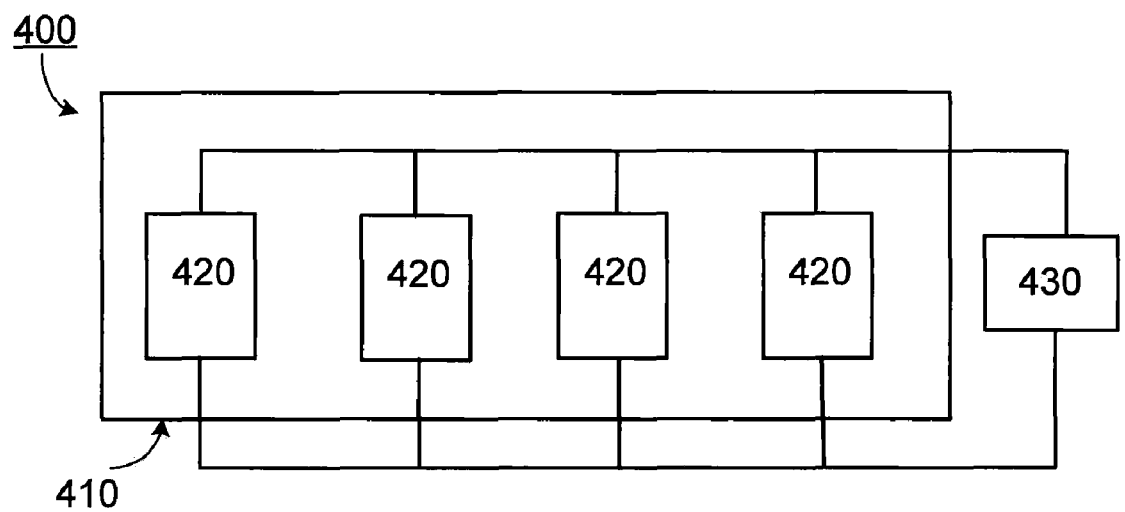
FIG. 4 is a schematic of a system containing multiple photovoltaic cells electrically connected in parallel.

Multiple photovoltaic cells can be electrically connected to form a photovoltaic system. As an example, FIG. 3 is a schematic of a photovoltaic system 300 having a module 310 containing photovoltaic cells 320. Cells 320 are electrically connected in series to an external load 330. As another example, FIG. 4 is a schematic of a photovoltaic system 400 having a module 410 that contains photovoltaic cells 420. Cells 420 are electrically connected in parallel to an external load 430. In some embodiments, some (e.g., all) of the photovoltaic cells in a photovoltaic system can have one or more common substrates. In certain embodiments, some photovoltaic cells in a photovoltaic system are electrically connected in series, and some of the photovoltaic cells in the photovoltaic system are electrically connected in parallel.

The following examples are illustrative and not intended to be limiting.

EXAMPLE 1

Preparation of Compound 1

Compound 1 was prepared by the following procedure.

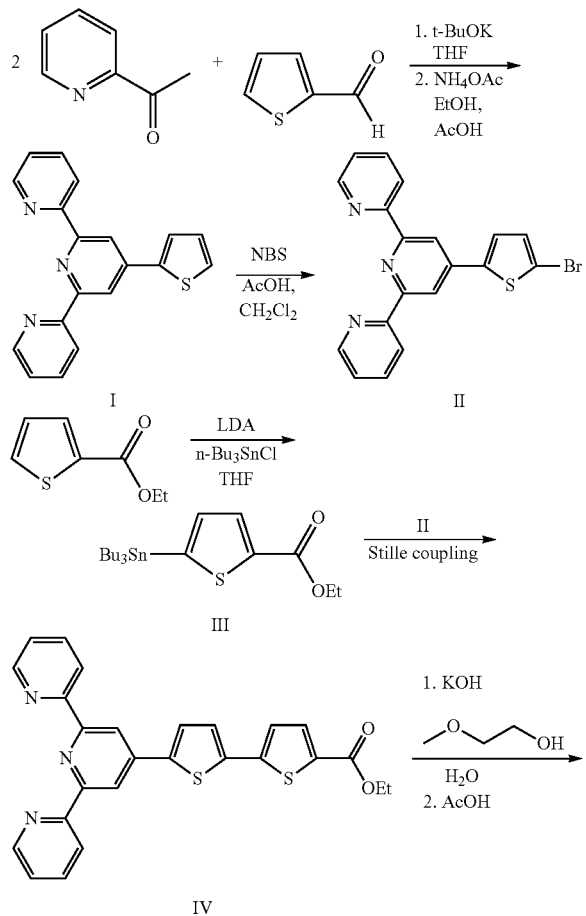

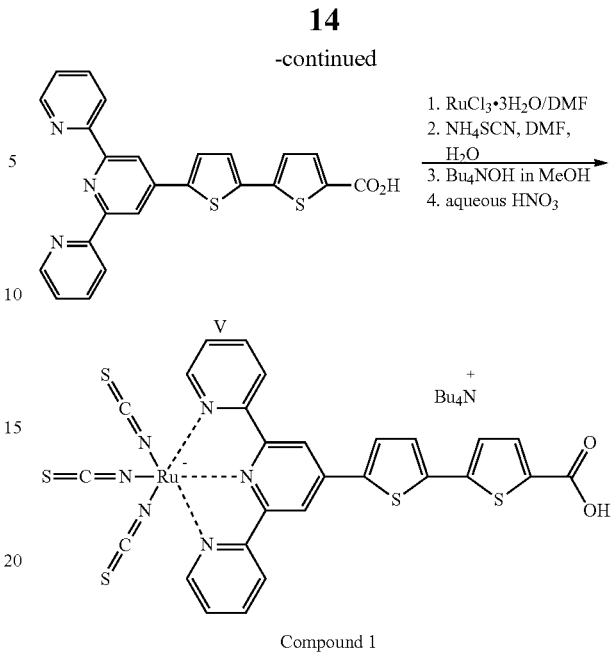

Compound 1

Synthesis 4'-(2-thienyl)-2,2:6,2"-terpyridine (I)

8.42 g (75 mmol) of potassium tert-butoxide and 200 ml of anhydrous THF were added under argon to a 1,000 ml 3NRB flask equipped with a magnetic stirrer, thermometer, and addition funnel. To the stirred solution was added dropwise 6.06 g of 2-acetylpyridine in 40 ml of THF. The mixture was stirred for 30 minutes at room temperature. A solution of 2.7 g of 2-thiophenecarboxaldehyde in 20 ml of THF was added dropwise and stirred for 21 hours under argon. To the mixture was added a solution of 38.5 g of $NH_4OAc$ in 300 ml ethanol and 150 ml acetic acid. The red solution thus formed was stirred under reflux for 5 hours, cooled to room temperature, and poured into 1 liter of ice/water. The tan precipitate was collected and dried under vacuum to give 4.31 g of a crude product. The crude product was purified by alumina column chromatography using $CH_2Cl_2$ as an eluant. After the eluted solution was collected and concentrated to 100 ml, 60 ml of methanol was added to precipitate the desired product (3.61 g, yield: 47.7%). The chemical structure of the product was confirmed by NMR spectroscopy.

Synthesis of 4'-(5-bromo-2-thienyl)-2,2:6,2"-terpyridine (II)

3.15 g of 4'-(2-thienyl)-2,2:6,2"-terpyridine (I) was added to 100 ml of $CH_2Cl_2$ and 150 ml of glacial acetic acid in a 500 ml round bottle. After portions of 2.00 g of N-bromosuccinimide was added, the solution was stirred at room temperature for 3 hours. 220 g of $NaHCO_3$ dissolved in 1,000 ml of water was then added dropwise to the solution. The resultant mixture was stirred overnight, allowed to evaporate the solvent $CH_2Cl_2$. The solid thus obtained was collected by filtration and washed with water. After the solid was extracted with $CH_2Cl_2$ using a soxhlet, methanol was added to the $CH_2Cl_2$ solution to give a white solid, which was filtered and dried to give 3.44 g (87.3%) of the desired product. The chemical structure of the product was confirmed by NMR spectroscopy.

Synthesis of ethyl 5-tributylstannylthiophene-2-carboxylate (III)

A 40 ml of 2.5 M solution of n-butyllithium in hexane was transferred under argon dropwise to a solution of 14 ml of diisopropylamine in 200 ml of anhydrous THF at −20° C. over 10 minutes. The solution was stirred at −20° C. for 3 hours and at 0° C. for fifteen minutes to form a lithium diisopropylamide (LDA) solution. The LDA solution was then cooled to −78° C. and a solution of 15.65 g ethyl thiophene-2-carboxylate in 25 ml THF was added dropwise. After the solution thus obtained was stirred for 1 hour at −78° C., 30 ml of tributyltin chloride in 25 ml of THF was added dropwise. The reaction was then stirred at −78° C. for another hour and at room temperature overnight. After 200 ml of water was slowly added, the organic layer was collected, dried with $Na_2SO_4$, and concentrated and then vacuum distilled at about 650 mTorr. The fraction between 162-165° C. was collected to give 26.71 g (60.0%) of the desired product as a light yellow liquid, whose chemical structure was confirmed by NMR spectroscopy.

Synthesis of ethyl 5'-[2,2':6',2"]terpyridin-4'-yl-[2,2'] bithiophenyl-5-carboxylate (IV)

2.67 g ethyl 5-tributylstannylthiophene-2-carboxylate in 20 ml of DMF was added to 1.58 g 4'-(5-bromo-2-thienyl)-2,2:6,2"-terpyridine and 70 mg of dichlorobis(triphenylphosphine)palladium under argon in a 35 ml flask while stirring. The reaction was heated under argon at 80° C. with stirring for 118 hours. After the reaction was cooled to room temperature, the mixture was poured into 200 ml of water. The mixture thus formed was extracted with 300 ml of $CH_2Cl_2$. After the $CH_2Cl_2$ layer was collected, 80 ml of methanol was added. The solution was then concentrated to about 80 ml and cooled to 10° C. The yellow solid thus formed was collected by filtration and dried in vacuum to yield 1.44 g of a crude product. The crude product was purified by column chromatography on a neutral alumina (300 g) eluting with $CH_2Cl_2$ followed by 10% MBTE/0.4% $Et_3N/CH_2Cl_2$ to give 1.31 g (70%) of the desired product as a yellow solid. The chemical structure of the product was confirmed by NMR spectroscopy.

Synthesis [2,2':6',2"]terpyridin-4'-yl-[2,2']bithiophenyl-5-carboxylic acid (V)

After 235 mg of ethyl 5'-[2,2':6',2"]terpyridin-4'-yl-[2,2'] bithiophenyl-5-carboxylate was added to 20 ml of 2-methoxyethanol, 1.32 g of KOH in 7 ml of water was added. The mixture was refluxed under argon for 3.5 hours. The solution was then evaporated to give a yellow solid. The solid was added to 2 ml of acetic acid in 40 ml of water, it was then collected by filtration and dried to yield 0.214 g (97%) of the desired product. The chemical structure of the product was confirmed by NMR spectroscopy.

Synthesis of Ru(NCS)$_3$.5'-[2,2':6',2"]terpyridin-4'-yl-[2,2']bithiophenyl-5-carboxylic acid (Compound 1)

A solution of 177 mg ethyl 5'-[2,2':6',2"]terpyridin-4'-yl-[2,2']bithiophenyl-5-carboxylate in 25 ml of DMF was added to 110 mg of RuCl3.3H2O in 25 ml of DMF was added under argon. The mixture was heated to 120° C. with stirring for 2.5 hours. A solution of 1.0 g ammonium thiocyanate in 5 ml of water was then added. The mixture was refluxed with stirring under argon for 4 hours without exposing to light. After the DMF was removed by evaporation, 30 ml of water was added.

The solid thus obtained was collected and washed with 30 ml of water. After the solid was suspended in 30 ml of methanol, 2 ml of 1 M Bu$_4$NOH was added with stirring. The mixture was then filtered and concentrated to about 15 ml. 3 ml of 1.6 M HNO$_3$ was added, followed by 25 ml of water. The precipitate thus formed was collected by filtration to give 366 mg (95%) a crude dye.

After 100 mg of the crude dye was added to 1 ml of methanol, 200 µl of 1 M of Bu$_4$NOH in methanol was added. The solution was purified on a Sephadex LH-20 column with methanol. The product band was collected, concentrated to ~15 ml, and acidified with 300 µl of 1.6 M HNO$_3$ and 15 ml of water. The solid was collected by filtration, washed with water, and dried in a vacuum oven to give 68 mg (64%) of a pure dye (Compound 1). The chemical structure of Compound 1 was confirmed by IR and NMR, and the molar extinction coefficient of Compound 1 was measured by UV/VIS spectroscopy. $\lambda_{max}$: 403 nm ($\epsilon$=31,000) and 612 nm ($\epsilon$=13,600).

EXAMPLE 2

Fabrication of Photovoltaic Cells

Fluorine doped tin oxide coated (FTO) glass slides (TEC15, 15 ohms/sq) were cleaned with simple green (detergent) and DI water, and rinsed by isopropanol. A cleaned FTO glass slide was coated with 25 µm thick TiO$_2$ film (with an average titanium oxide nanoparticle diameter of 20 nm) and sintered at 450° C. for 30 minutes. When the slide was cooled down to 80° C., it was dropped in a 0.5 mM dye solution containing either a control black dye or Compound 1 in 1:1 acetonitrile:t-butanol and sensitized overnight (15 hours) at room temperature. The control dye was described in Gratzel et al., J. Am. Chem. Soc., 2001, 123, 1613 and U.S. Pat. No. 6,245,988, the entire contents of which are incorporated herein by reference. The slide was then removed from the dye solution, rinsed with acetonitrile, and air dried for 5 minutes. The sensitized TiO$_2$ film on a FTO glass slide was sandwiched with a platinized FTO glass slide using a SURLYN film to form a cell. The platinized FTO glass slide was prepared by coating a thin film of Pt from a 7 mM hexachloroplatinic acid solution in ethanol using a glass tip followed by heat treatment at 375° C. for 30 minutes.

The cell formed above was filled with a liquid electrolyte (0.8 M butyl methyl imidazolium iodide, 0.5 M t-butyl pyridine in 3:1 acetonitrile:valeronitrile) under vacuum through a pre-drilled hole on the counter electrode and then sealed by a SURLYN film.

Two photovoltaic cells were prepared by using each of the control dye and Compound 1. The I-V characteristics of photovoltaic cells were measured using a simulated solar tester operating at AM 1.5 conditions. The absorptions of the control dye and Compound 1 at a maximum wavelength were measured by UV/VIS spectroscopy.

The UV/VIS spectra show that the control dye has a molar extinction coefficient (epsilon, $\epsilon$) of about 7,800 at $\lambda_{max}$ of 620 nm, while compound 1 has a molar extinction coefficient of about 13,600 at λmax of 612 nm, about 1.7 times as high as that of the control dye. The I-V measurements show that the photovoltaic cells containing the control dye have an average efficiency of 6.4%, while the photovoltaic cells containing Compound 1 have an average efficiency of 3.9%. Without wishing to be bound by theory, it is believed that the reduced efficiency of the photovoltaic cells containing Compound 1 resulted from the impurities in Compound 1.

Other embodiments are in the claims.

What is claimed is:

1. A compound, comprising a complex formula (Ia):

$$MX_3L \quad \text{(Ia)}$$

wherein

M is a transition metal ion;

each X, independently, is a monodentate ligand selected from the group consisting of thiocyanate, isothiocyanate, and pyridine optionally substituted with halo, $C_1$-$C_{20}$ alkoxy, $C_1$-$C_{20}$ alkyl, $C_2$-$C_{20}$ alkenyl, $C_2$-$C_{20}$ alkynyl, $C_3$-$C_{20}$ cycloalkyl, $C_3$-$C_{20}$ cycloalkenyl, $C_1$-$C_{20}$ heterocycloalkyl, $C_1$-$C_{20}$ heterocycloalkenyl, aryl, or heteroaryl; and L is a tridentate ligand of formula (II):

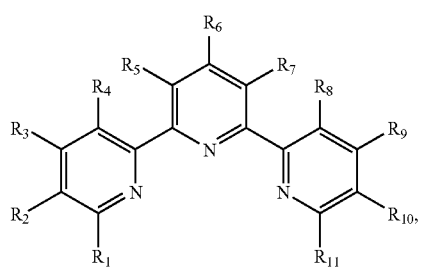

in which $R_6$ is

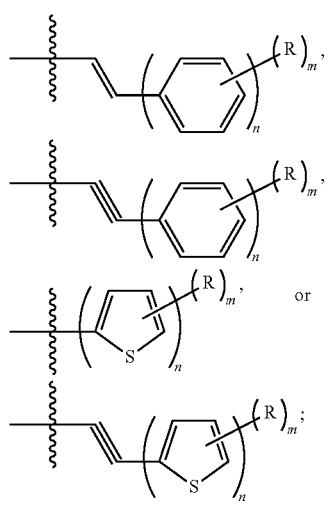

in which n is 1, 2, or 3; m is 1, 2, or 3; and each R, independently, is COOH, $PO_3H$,

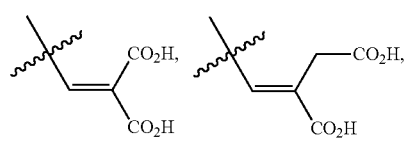

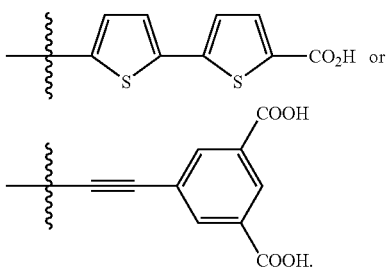

and each of $R_1$, $R_2$, $R_3$, $R_4$, $R_5$, $R_7$, $R_8$, $R_9$, $R_{10}$, and $R_{11}$, independently, is H, COOH, $PO_3H$, halo, $C_1$-$C_{20}$ alkoxy, $C_1$-$C_{20}$ alkyl, $C_2$-$C_{20}$ alkenyl, $C_2$-$C_{20}$ alkynyl, $C_3$-$C_{20}$ cycloalkyl, $C_3$-$C_{20}$ cycloalkenyl, $C_1$-$C_{20}$ heterocycloalkyl, $C_1$-$C_{20}$ heterocycloalkenyl, aryl, heteroaryl, alkenylaryl, alkynylaryl, alkenylheteroaryl, or alkynylheteroaryl.

2. The compound of claim 1, wherein $R_6$ is

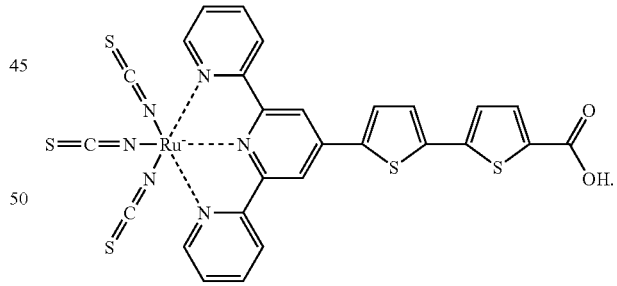

3. The compound of claim 1, wherein the transition metal ion is selected from the group consisting of ruthenium ions, osmium ions, and iron ions.

4. The compound of claim 3, wherein the transition metal ion is Ru(II), Os(II), or Fe(II).

5. The compound of claim 3, wherein the transition metal ion is Ru(II).

6. The compound of claim 1, wherein each X is isothiocyanate.

7. The compound of claim 1, wherein the complex is

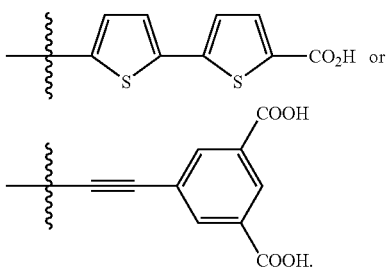

8. The compound of claim 1, wherein each of $R_3$ and $R_9$, independently, is alkenylaryl, alkynylaryl, heteroaryl, or alkynylheteroaryl.

9. The compound of claim 8, wherein each of $R_3$ and $R_9$, independently, is

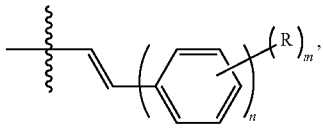

-continued

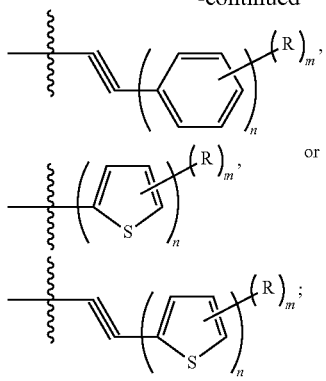

in which n is 1, 2, or 3; m is 1, 2, or 3; and each R, independently, is COOH, PO$_3$H,

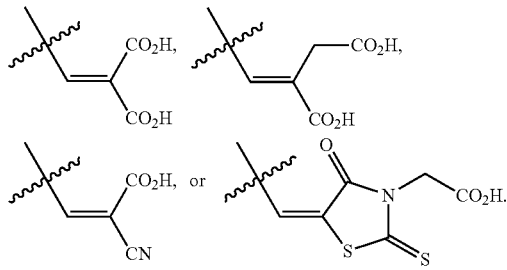

10. The compound of claim 1, further comprising a counterion.

11. The compound of claim 10, wherein the counterion is Bu$_4$N$^+$.

12. An article, comprising:
first and second electrodes; and
a photoactive layer between the first and second electrodes, the photoactive layer comprising the compound of claim 1;
wherein the article is configured as a photovoltaic cell.

13. The article of claim 12, wherein the photoactive layer further comprises interconnected metal oxide nanoparticles associated with the compound.

14. A module, comprising a plurality of photovoltaic cells, at least two of the photovoltaic cells being electrically connected and at least one of the photovoltaic cells comprising the compound of claim 1.

15. A compound, comprising a complex of formula (Ia):

$$MX_3L \quad (Ia), and$$

a counterion Bu$_4$N$^+$,
wherein
M is a transition metal ion;
each X, independently, is a monodentate ligand selected from the group consisting of thiocyanate, isothiocyanate, and pyridine optionally substituted with halo, C$_1$-C$_{20}$ alkoxy, C$_1$-C$_{20}$ alkyl, C$_2$-C$_{20}$ alkenyl, C$_2$-C$_{20}$ alkynyl, C$_3$-C$_{20}$ cycloalkyl, C$_3$-C$_{20}$ cycloalkenyl, C$_1$-C$_{20}$ heterocycloalkyl, C$_1$-C$_{20}$ heterocycloalkenyl, aryl, or heteroaryl; and L is a tridentate ligand of formula (II):

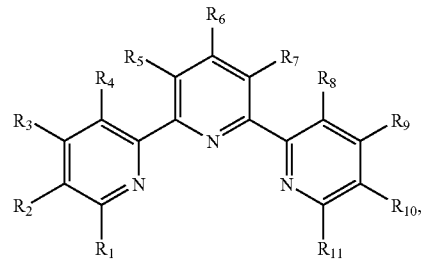

in which
R$_6$ is

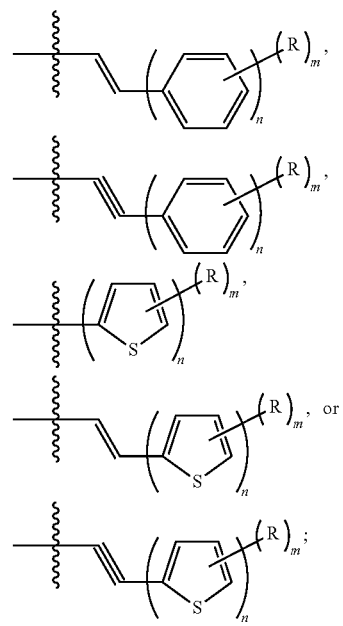

in which n is 1, 2, or 3; m is 1, 2, or 3; and each R, independently, is COOH, PO$_3$H,

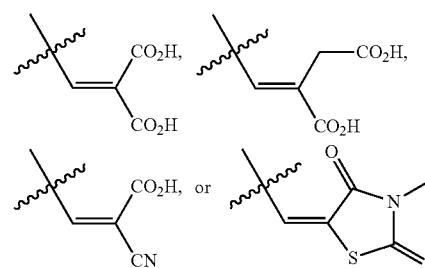

and
each of R$_1$, R$_2$, R$_3$, R$_4$, R$_5$, R$_7$, R$_8$, R$_9$, R$_{10}$, and R$_{11}$, independently, is H, COOH, PO$_3$H, halo, C$_1$-C$_{20}$ alkoxy, C$_1$-C$_{20}$ alkyl, C$_2$-C$_{20}$ alkenyl, C$_2$-C$_{20}$ alkynyl, C$_3$-C$_{20}$ cycloalkyl, C$_3$-C$_{20}$ cycloalkenyl, C$_1$-C$_{20}$ heterocycloalkyl, C$_1$-C$_{20}$ heterocycloalkenyl, aryl, heteroaryl, alkenylaryl, alkynylaryl, alkenylheteroaryl, or alkynylheteroaryl.

16. The compound of claim 15, wherein $R_6$ is

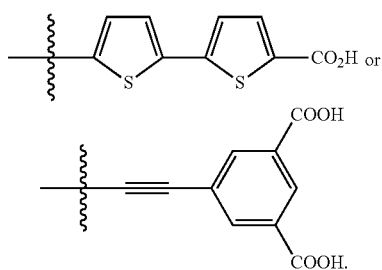

17. The compound of claim 15, wherein the transition metal ion is selected from the group consisting of ruthenium ions, osmium ions, and iron ions.

18. The compound of claim 17, wherein the transition metal ion is Ru(II), Os(II), or Fe(II).

19. The compound of claim 17, wherein the transition metal ion is Ru(II).

20. The compound of claim 15, wherein each X is isothiocyanate.

21. The compound of claim 15, wherein the complex is

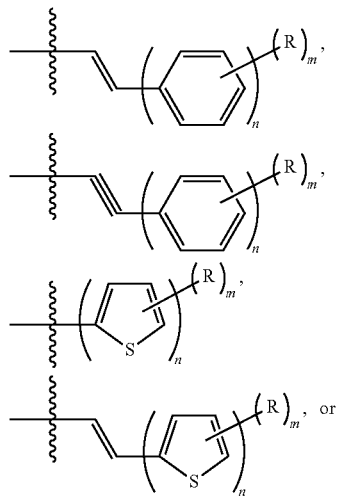

22. The compound of claim 15, wherein each of $R_3$ and $R_9$, independently, is alkenylaryl, alkynylaryl, heteroaryl, alkenylheteroaryl, or alkynylheteroaryl.

23. The compound of claim 22, wherein each of $R_3$ and $R_9$, independently, is

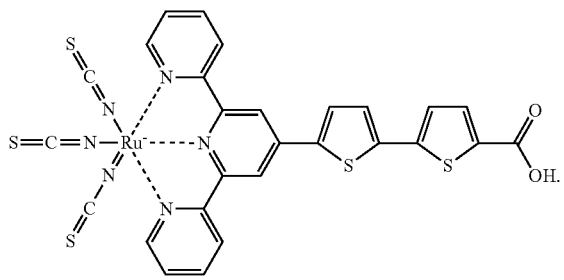

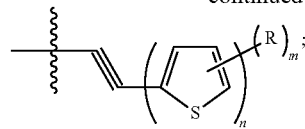

in which n is 1, 2, or 3; m is 1, 2, or 3; and each R, independently, is COOH, $PO_3H$,

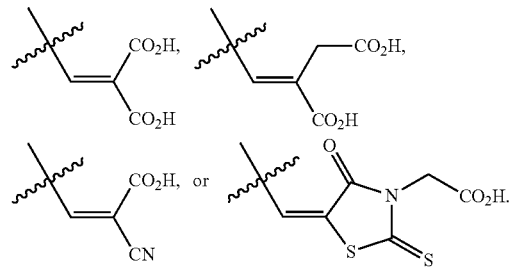

24. An article, comprising:
first and second electrodes; and
a photoactive layer between the first and second electrodes, the photoactive layer comprising the compound of claim 15;
wherein the article is configured as a photovoltaic cell.

25. The article of claim 24, wherein the photoactive layer further comprises interconnected metal oxide nanoparticles associated with the compound.

26. A module, comprising a plurality of photovoltaic cells, at least two of the photovoltaic cells being electrically connected and at least one of the photovoltaic cells comprising the compound of claim 15.

27. A compound, comprising a complex of formula (Ia):

$$MX_3L \qquad (Ia)$$

wherein
M is a transition metal ion;
each X, independently, is a monodentate ligand selected from the group consisting of thiocyanate, isothiocyanate, and pyridine optionally substituted with halo, $C_1$-$C_{20}$ alkoxy, $C_1$-$C_{20}$ alkyl, $C_2$-$C_{20}$ alkenyl, $C_2$-$C_{20}$ alkynyl, $C_3$-$C_{20}$ cycloalkyl, $C_3$-$C_{20}$ cycloalkenyl, $C_1$-$C_{20}$ heterocycloalkyl, $C_1$-$C_{20}$ heterocycloalkenyl, aryl, or heteroaryl; and
L is a tridentate ligand of formula (II):

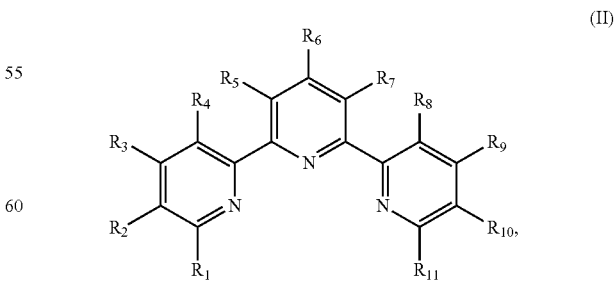

in which
$R_3$ is H, COOH, $PO_3H$, halo, $C_1$-$C_{20}$ alkoxy, $C_1$-$C_{20}$ alkyl, $C_2$-$C_{20}$ alkynyl, $C_3$-$C_{20}$ cycloalkyl, $C_3$-$C_{20}$ cycloalkenyl, $C_1$-$C_{20}$ heterocycloalkyl, $C_1$-$C_{20}$ heterocycloalkenyl, aryl, heteroaryl, alkynylaryl, alkenylheteroaryl, or alkynylheteroaryl;

$R_6$ is

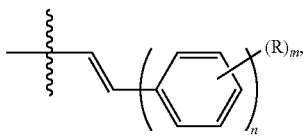

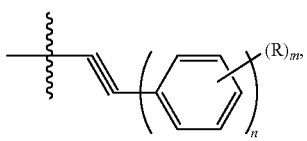

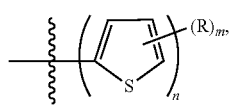

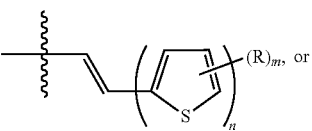

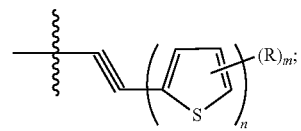

in which n is 1, 2, or 3; m is 1, 2, or 3; and each R, independently, is COOH, $PO_3H$,

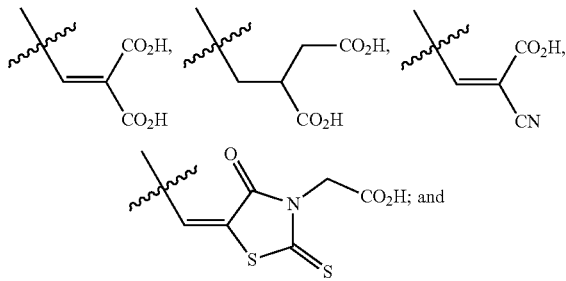 [SMILES: *C=C(C(=O)O)C(=O)O ; *CC(CC(=O)O)C(=O)O ; */C=C(/C#N)C(=O)O ; */C=C1/SC(=S)N(CC(=O)O)C1=O]

each of the others of $R_1$, $R_2$, $R_4$, $R_5$, $R_7$, $R_8$, $R_9$, $R_{10}$, and $R_{11}$, independently, is H, COOH, $PO_3H$, halo, $C_1$-$C_{20}$ alkoxy, $C_1$-$C_{20}$ alkyl, $C_2$-$C_{20}$ alkenyl, $C_2$-$C_{20}$ alkynyl, $C_3$-$C_{20}$ cycloalkyl, $C_3$-$C_{20}$ cycloalkenyl, $C_1$-$C_{20}$ heterocycloalkyl, $C_1$-$C_{20}$ heterocycloalkenyl, aryl, heteroaryl, alkenylaryl, alkynylaryl, alkenylheteroaryl, or alkynylheteroaryl.

28. The compound of claim 27, wherein $R_6$ is

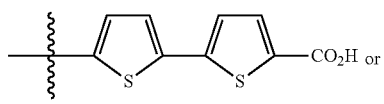

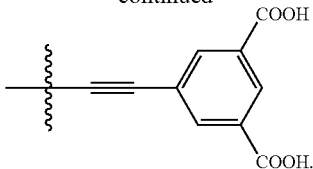

29. The compound of claim 27, wherein the transition metal ion is selected from the group consisting of ruthenium ions, osmium ions, and iron ions.

30. The compound of claim 29, wherein the transition metal ion is Ru(II), Os(II), or Fe(II).

31. The compound of claim 29, wherein the transition metal ion is Ru(II).

32. The compound of claim 27, wherein each X is isothiocyanate.

33. The compound of claim 27, wherein each of $R_3$ and $R_9$, independently, is alkynylaryl, heteroaryl, alkenylheteroaryl, or alkynylheteroaryl.

34. The compound of claim 33, wherein each of $R_3$ and $R_9$, independently, is

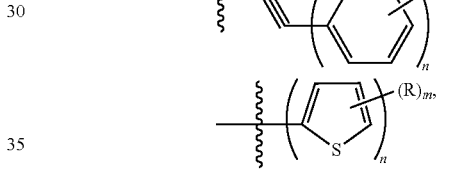

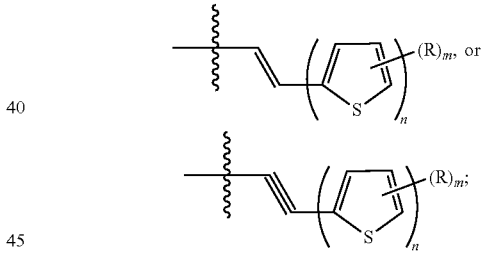

in which n is 1, 2, or 3; m is 1, 2, or 3; and each R, independently, is COOH, $PO_3H$

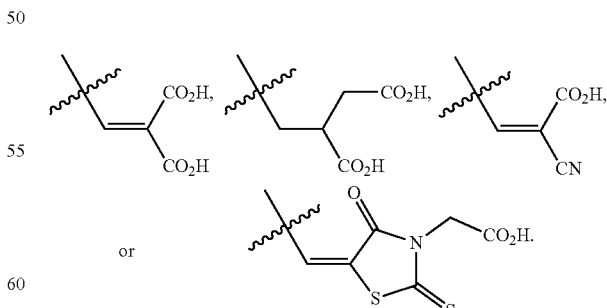

35. The compound of claim 27, further comprising a counterion.

36. The compound of claim 35, wherein the counterion is $Bu_4N^+$.

37. An article, comprising:
first and second electrodes; and
a photoactive layer between the first and second electrodes, the photoactive layer comprising the compound of claim 27;
wherein the article is configured as a photovoltaic cell.

38. The article of claim 37, wherein the photoactive layer further comprises interconnected metal oxide nanoparticles associated with the compound.

39. A module, comprising a plurality of photovoltaic cells, at least two of the photovoltaic cells being electrically connected and at least one of the photovoltaic cells comprising the compound of claim 27.

* * * * *

UNITED STATES PATENT AND TRADEMARK OFFICE
CERTIFICATE OF CORRECTION

PATENT NO. : 8,383,553 B2  
APPLICATION NO. : 12/236150  
DATED : February 26, 2013  
INVENTOR(S) : Richard A. Minns and David Waller Page 1 of 1

It is certified that error appears in the above-identified patent and that said Letters Patent is hereby corrected as shown below:

On the Title Page, in the TITLE (54), and in the Specifications, Column 1, line 1, replace "DYES" with --NOVEL DYES--.

In the Claims:

In Claim 27, at column 23, line 52, delete "of the others".

Signed and Sealed this  
Fourteenth Day of May, 2013

Teresa Stanek Rea  
*Acting Director of the United States Patent and Trademark Office*

UNITED STATES PATENT AND TRADEMARK OFFICE
CERTIFICATE OF CORRECTION

| | | |
|---|---|---|
| PATENT NO. | : 8,383,553 B2 | Page 1 of 1 |
| APPLICATION NO. | : 12/236150 | |
| DATED | : February 26, 2013 | |
| INVENTOR(S) | : Richard A. Minns et al. | |

It is certified that error appears in the above-identified patent and that said Letters Patent is hereby corrected as shown below:

<u>Title Page,</u>
Item [54], Title, and in the Specification, column 1, line 1, the word "NOVEL" (as inserted by Certificate of Correction issued May 14, 2013) should be deleted and title is reinstated to read
-- DYES --.

Signed and Sealed this
Eleventh Day of June, 2013

Teresa Stanek Rea
*Acting Director of the United States Patent and Trademark Office*